US011309119B2

United States Patent
Tseng et al.

(10) Patent No.: US 11,309,119 B2
(45) Date of Patent: Apr. 19, 2022

(54) ON-CHIP BALUN TRANSFORMER

(71) Applicant: Airoha Technology Corp., Hsinchu (TW)

(72) Inventors: Kuo-Yu Tseng, Taoyuan (TW); Shih-Chieh Chien, Chiayi (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 876 days.

(21) Appl. No.: 16/034,680

(22) Filed: Jul. 13, 2018

(65) Prior Publication Data

US 2019/0180916 A1   Jun. 13, 2019

(30) Foreign Application Priority Data

Dec. 12, 2017 (TW) ................... 106143623

(51) Int. Cl.
| | | |
|---|---|---|
| H01F 27/28 | (2006.01) | |
| H03H 7/42 | (2006.01) | |
| H03H 1/00 | (2006.01) | |
| H01L 23/64 | (2006.01) | |
| H01F 21/12 | (2006.01) | |

(52) U.S. Cl.
CPC ......... *H01F 27/2804* (2013.01); *H01F 21/12* (2013.01); *H01L 23/645* (2013.01); *H03H 1/00* (2013.01); *H03H 7/42* (2013.01); *H01F 2027/2809* (2013.01); *H03H 2001/0085* (2013.01)

(58) Field of Classification Search
USPC .................. 336/173, 223, 232, 200
See application file for complete search history.

(56) References Cited

U.S. PATENT DOCUMENTS

| | | | |
|---|---|---|---|
| 6,577,219 B2 | 6/2003 | Visser | |
| 7,456,721 B2 | 11/2008 | Chiu | |
| 7,482,904 B2 | 1/2009 | Lee et al. | |
| 7,821,372 B2 | 10/2010 | Ho-Hsiang | |
| 8,505,193 B2 | 8/2013 | Papananos | |
| 2004/0207504 A1 | 10/2004 | Yang et al. | |
| 2005/0104706 A1* | 5/2005 | Chou ................. | H01F 27/2804 336/200 |
| 2009/0039977 A1 | 2/2009 | Lee et al. | |
| 2010/0060402 A1* | 3/2010 | Chen ..................... | H03H 7/422 336/200 |
| 2015/0270054 A1* | 9/2015 | Huang ................ | H01F 27/2804 336/170 |
| 2016/0027571 A1* | 1/2016 | Zhang .................... | H01F 19/04 336/173 |
| 2016/0248450 A1* | 8/2016 | Ishizuka .............. | H04B 1/0053 |
| 2017/0117868 A1* | 4/2017 | Ishizuka .................. | H03H 7/19 |
| 2017/0229900 A1* | 8/2017 | Cho ...................... | H02J 50/005 |

* cited by examiner

*Primary Examiner* — Shawki S Ismail
*Assistant Examiner* — Kazi S Hossain
(74) *Attorney, Agent, or Firm* — McClure, Qualey & Rodack, LLP

(57) ABSTRACT

An on-chip balun transformer including a primary winding and a secondary winding is provided. The primary winding includes at least one parallel coil and a plurality of first serial semi-turn coils connected to the at least one parallel coil. The secondary winding, magnetically coupled to the primary winding, includes a plurality of second serial semi-turn coils connected to each other. At least one of the second serial semi-turn coils is located within the at least one parallel coil. The primary winding and the secondary winding are coplanar.

5 Claims, 18 Drawing Sheets

4V: V9A, V10A, V17A
5M: CS1A, CS6A, CS11A

3V: V9A, V10A, V17A
4M: CS7A

2V: V17A
3M: CS7A
2M: CS13A

4V:V1B,V2B,V13B
4M:CS1B

3M:CS1B
3V:V1B,V2B,V13B

3M:CS1B
2M:CS12B
2V:V13B

4M:CS13C,CS14C
3V:V23C

3M:CS13C,CS14C
2V:V23C

2M:CS15C

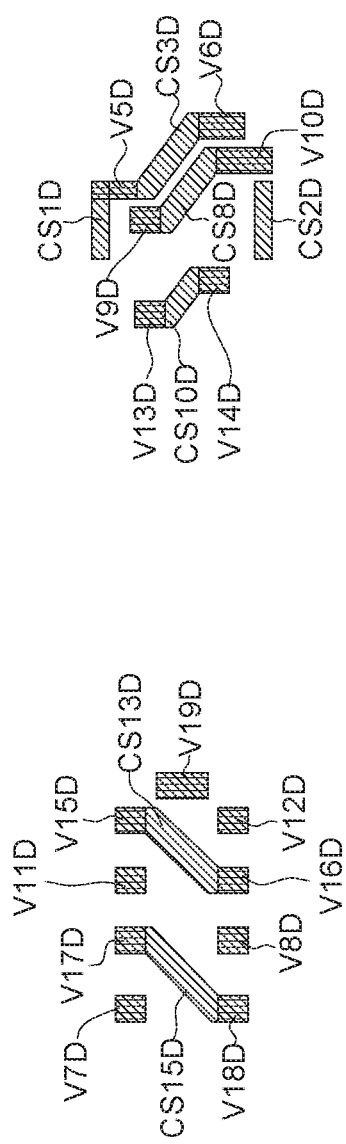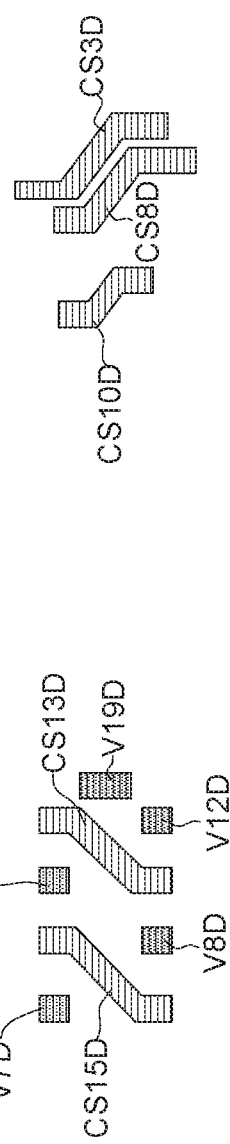
FIG. 9B
FIG. 9C

4M:CS7D,CS9D
3V:V7D,V8D,V11D,
V12D,V19D

3M:CS7D,CS9D
2V:V19D

2M:CS16D

ON-CHIP BALUN TRANSFORMER

This application claims the benefit of Taiwan application Serial No. 106143623, filed Dec. 12, 2017, the subject matter of which is incorporated herein by reference.

BACKGROUND OF THE INVENTION

Field of the Invention

The invention relates in general to an on-chip balun transformer.

Description of the Related Art

The on-chip balun transformer has been widely used in the field of wireless communication, for example, the power amplifier circuit of a wireless communication device. The on-chip balun transformer has a higher turn ratio for providing high impedance matching and low impedance matching. Besides, the on-chip balun transformer has high coupling factor for reducing voltage conversion loss.

Furthermore, since the wireless communication device works in higher and higher communication frequency, the on-chip balun transformer is used in the technology field of high frequency application.

SUMMARY OF THE INVENTION

According to one embodiment of the present invention, an on-chip balun transformer including a primary winding and a secondary winding is provided. The primary winding, being an asymmetrical winding inductor, includes at least one parallel coil and a plurality of first serial semi-turn coils connected to the at least one parallel coil. The secondary winding, being a symmetrical winding inductor and magnetically coupled to the primary winding, includes a plurality of second serial semi-turn coils connected to each other. At least one of the second serial semi-turn coils is located within the at least one parallel coil. The primary winding and the secondary winding are coplanar.

The above and other contents of the invention will become better understood with regard to the following detailed description of the preferred but non-limiting embodiment(s). The following description is made with reference to the accompanying drawings.

BRIEF DESCRIPTION OF THE DRAWINGS

FIGS. 9A-9F respectively are schematic diagrams of the balun transformer elements formed on the metal layers 2M-7M in the fourth embodiment of the present disclosure.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present disclosure has one or more technical characteristics. Given that each embodiment is implementable, a person ordinarily skilled in the art may selectively implement or combine some or all of the technical characteristics of any embodiment of the present disclosure.

First Embodiment

Figure 1:
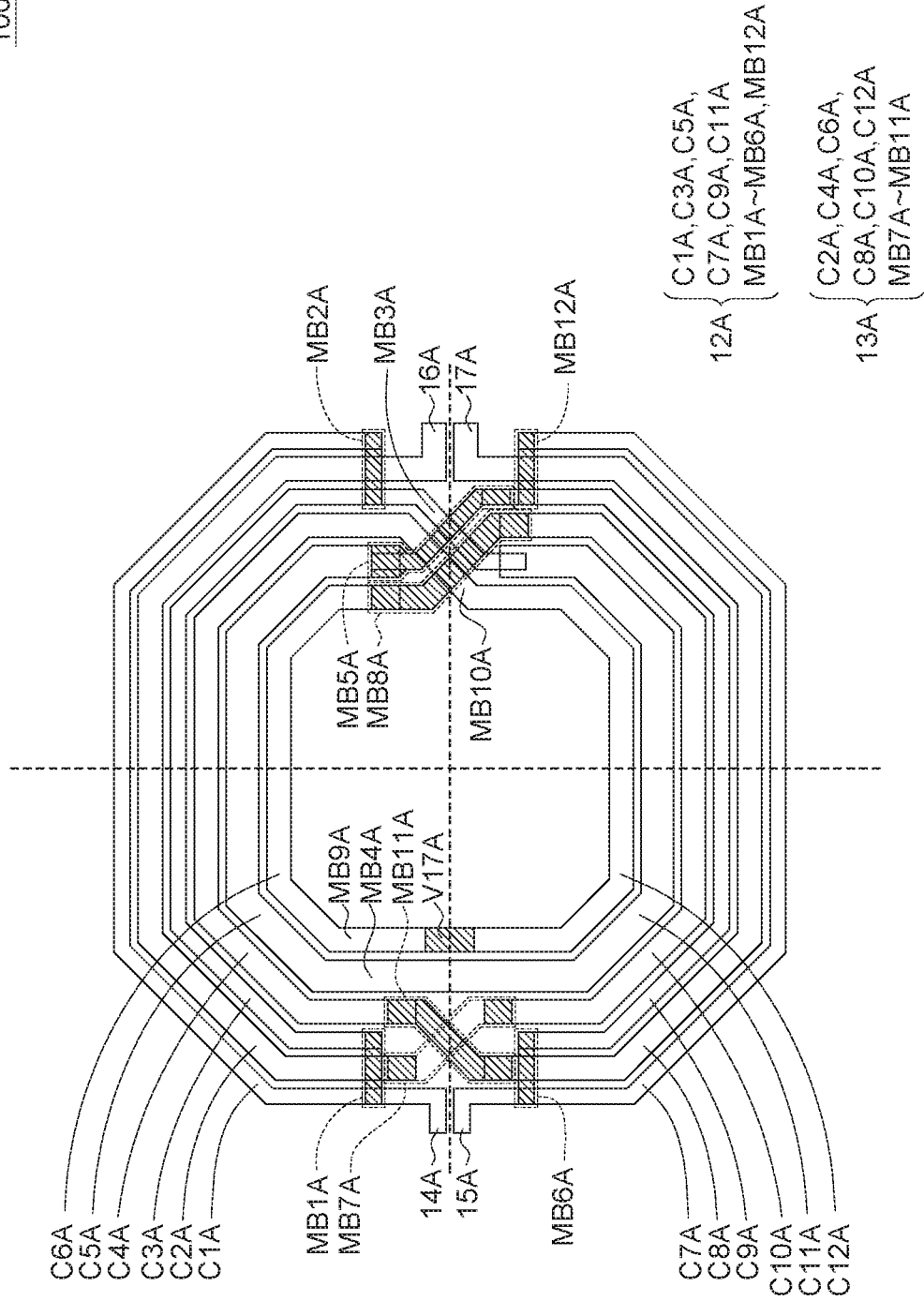
FIG. 1 is a front view of an on-chip balun transformer according to a first embodiment of the present disclosure.
Figure 2:
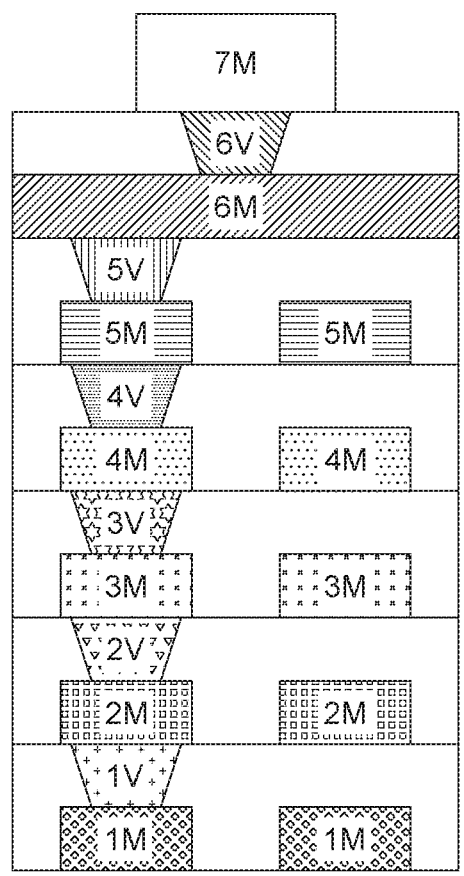
FIG. 2 is a cross-sectional view of FIG. 1 showing that the balun transformer has a 7-layered structure (including metal layers 1M-7M).

Refer to FIGS. 1, 2 and 3A-3F. FIG. 1 is a front view of an on-chip balun transformer according to a first embodiment of the present disclosure. FIG. 2 is a cross-sectional view of FIG. 1 showing that the balun transformer has a 7-layered structure (including metal layers 1M-7M), FIGS. 3A-3F respectively are schematic diagrams of the balun transformer elements formed on the metal layers 2M-7M in the first embodiment of the present disclosure.

The on-chip balun transformer 100A according to the first embodiment of the present disclosure includes a primary winding 12A and a secondary winding 13A. The primary winding 12A is magnetically coupled to the secondary winding 13A. The primary winding 12A and the secondary winding 13A are coplanar.

The primary winding 12A includes semi-turn coils C1A, C3A, C5A, C7A, C9A and C11 and metal bridges MB1A-MB6A and MB12A.

Moreover, the primary winding 12A further includes a first port 14A and a second port 15A. The first port 14A is connected to the semi-turn coil C1A. The second port 15A is connected to the semi-turn coil C7A. The primary winding 12A may be coupled/connected to an antenna (not illustrated) through the first port 14A and the second port 15A.

The secondary winding 13A includes semi-turn coils C2A, C4A, C6A, C8A, C10A and C12A, and metal bridges MB7A-MB11A. The secondary winding 13A further includes a third port 16A and a fourth port 17A. The third port 16A is connected to the semi-turn coil C2A. The fourth port 17A is connected to the semi-turn coil C8A. The secondary winding 13A may be coupled/connected to a back-end circuit (such as a differential amplifier) through the third port 16A and the fourth port 17A.

The semi-turn coil C1A and the semi-turn coil C3A form a first parallel semi-turn coil through the metal bridges MB1A and MB2A. The first parallel semi-turn coil is connected to the semi-turn coil C11A through the metal bridge MB3A.

Similarly, the semi-turn coil C7A and the semi-turn coil C9A form a second parallel semi-turn coil through the metal bridges MB6A and MB12A. The second parallel semi-turn coil is connected to the semi-turn coil C5A through the metal bridge MB5A.

The right end of the semi-turn coil C1A is connected to the right end of the semi-turn coil C11A through the metal bridges MB2A and MB3A. The left end of the semi-turn coil C1A is connected to the first port 14A.

The right end of the semi-turn coil C2A is connected to the third port 16A. The left end of the semi-turn coil C2A is connected to the left end of the semi-turn coil C10A through the metal bridge MB7A.

The right end of the semi-turn coil C3A is connected to the right end of the semi-turn coil C11A through the metal bridge MB3A. The left end of the semi-turn coil C3A is connected to the first port 14A through the metal bridge MB1A.

The right end of the semi-turn coil C4A is connected to the right end of the semi-turn coil C12A through the metal bridge MB10A. The left end of the semi-turn coil C4A is connected to the left end of the semi-turn coil C8A through the metal bridge MB11A.

The right end of the semi-turn coil C5A is connected to the right end of the semi-turn coil C9A through the metal bridge MB5A. The left end of the semi-turn coil C5A is connected to the left end of the semi-turn coil C11A through the metal bridge MB4A.

The right end of the semi-turn coil C6A is connected to the right end of the semi-turn coil C10A through the metal bridge MB8A. The left end of the semi-turn coil C6A is connected to the left end of the semi-turn coil C12A through the metal bridge MB9A.

The right end of the semi-turn coil C7A is connected to the right end of the semi-turn coil C5A through the metal bridges MB12A and MB5A. The left end of the semi-turn coil C7A is connected to the second port 15A.

The right end of the semi-turn coil C8A is connected to the fourth port 17A. The left end of the semi-turn coil C8A is connected to the left end of the semi-turn coil C4A through the metal bridge MB11A.

The right end of the semi-turn coil C9A is connected to the right end of the semi-turn coil C5A through the metal bridge MB5A. The left end of the semi-turn coil C9A is connected to the second port 15A through the metal bridge MB6A.

The right end of the semi-turn coil C10A is connected to the right end of the semi-turn coil C6A through the metal bridge MB8A. The left end of the semi-turn coil C10A is connected to the left end of the semi-turn coil C2A through the metal bridge MB7A.

The right end of the semi-turn coil C11A is connected to the right end of the semi-turn coil C3A through the metal bridge MB3A. The left end of the semi-turn coil C11A is connected to the left end of the semi-turn coil C5A through the metal bridge MB4A.

The right end of the semi-turn coil C12A is connected to the right end of the semi-turn coil C4A through the metal bridge MB10A. The left end of the semi-turn coil C12A is connected to the left end of the semi-turn coil C6A through the metal bridge MB9A.

The metal bridge MB1A includes vias V1A and V2A and a conducting section CS1A electrically connected to the vias V1A and V2A. The metal bridge MB2A includes vias V3A and V4A and a conducting section CS2A electrically connected to the vias V3A and V4A, The metal bridge MB5A includes vias V5A, V6A and a conducting section CS5A electrically connected to the vias V5A and V6A. The metal bridge MB6A includes vias V7A, V8A and a conducting section CS6A electrically connected to the vias V7A and V8A. The metal bridge MB1A includes vias V9A, V10A and a conducting section CS7A electrically connected to the vias V9A and V10A. The metal bridge MB8A includes vias V11A, V12A and a conducting section CS8A electrically connected to the vias V11A and V12A. The metal bridge MB11A includes vias V13A, V14A and a conducting section CS11A electrically connected to the vias V13A and V14A. The metal bridge MB12A includes vias V15A, V16A and a conducting section CS12A electrically connected to the vias V15A and V16A.

As indicated in FIG. 2, the on-chip balun transformer 100A is formed in N (N is a positive integer, and is equivalent to 7 in FIG. 2, N) metal layers on a semiconductor substrate in a bottom-up manner.

Figure 3A:
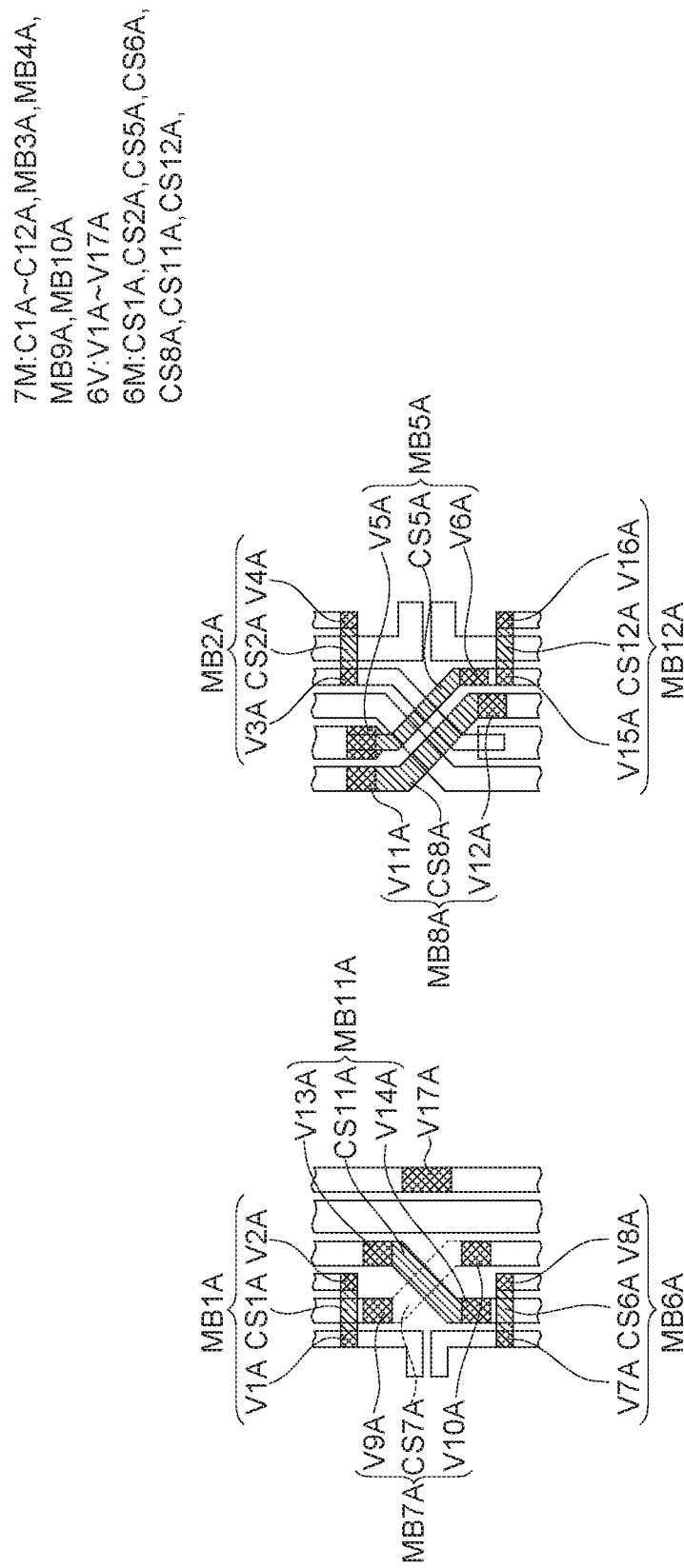
FIGS. 3A-3F respectively are schematic diagrams of the balun transformer elements formed on the metal layers 2M-7M in the first embodiment of the present disclosure.

As indicated in FIG. 3A, the elements formed on the metal layer 7M include the semi-turn coils C1A-C12A and the metal bridges MB3A, MB4A, MB9A and MB10A.

The vias V1A-V17A pass through the metal layer 7M and the metal layer 6M (the said vias are designated by 6V, and the designations 1V-5V are defined in the same way). The conducting sections CS1A, CS2A, CS5A, CS6A, CS8A, CS11A and CS12A are formed on the metal layer 6M.

Let the metal bridge MB1A be taken for example. Based on the architecture that the via V1A and V2A of the metal bridge MB1A pass through the metal layer 7M and the metal layer 6M and that the conducting section CS1A is formed on the metal layer 6M, the semi-turn coil C1A and the semi-turn coil C3A may therefore be electrically connected to each other.

Figure 3B:
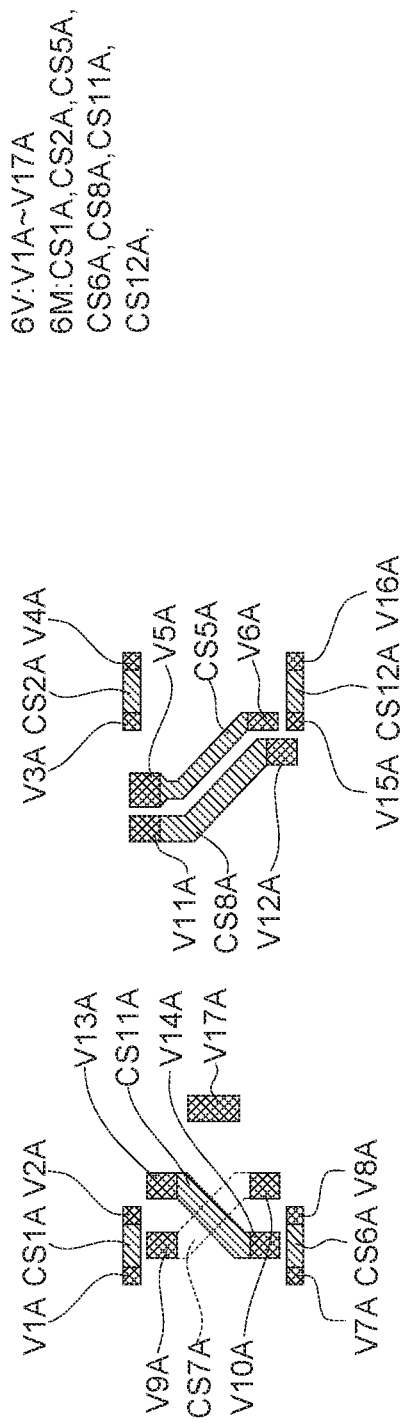

As indicated in FIG. 3B, the vias V1A-V17A pass through the metal layer 7M and the metal layer 6M (the said vias are designated by 6V); the conducting section CS1A, CS2A, CS5A, CS6A, CS7A, CS8A, CS11A and CS12A are formed on the metal layer 6M.

Figure 3C:
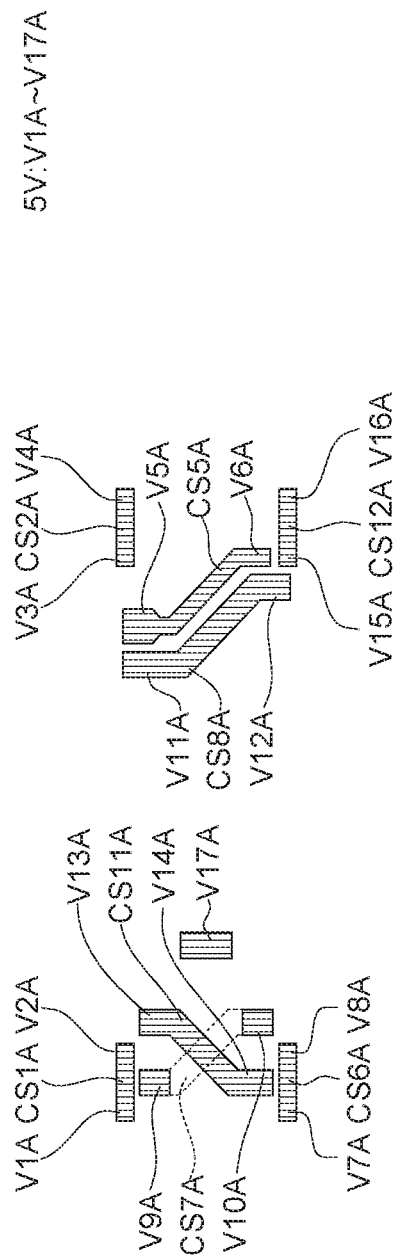

As indicated in FIG. 3C, the vias V1A-V17A further pass through the metal layer 6M and the metal layer 5M (the said vias are designated by 5V).

Figure 3D:
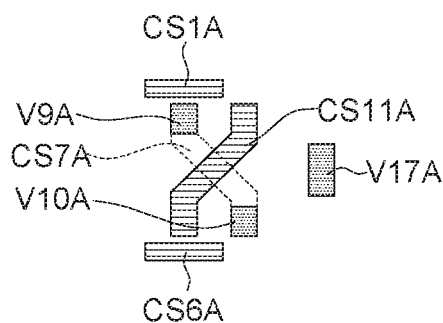

As indicated in FIG. 3D, the conducting sections CS1A, CS6A and CS11A are formed on the metal layer 5M; the vias V9A, V10A and V17A further pass through the metal layers 5M and 4M (the said vias are designated by 4V). In the first embodiment of the present disclosure, if the conducting sections (such as CS1A, CS6A and CS11A) are formed on multiple metal layers, the resistance values of the conducting sections will be reduced. The vias V9A and V10A pass through the metal layers 4M-7M, and connect the semi-turn coils C2A and C10A through the metal bridge MB7A.

Figure 3E:
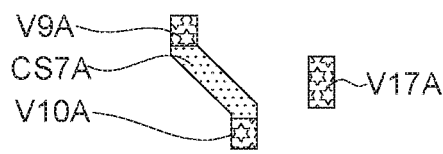

As indicated in FIG. 3E, the conducting section CS7A is formed on the metal layer 4M; the vias V9A, V10A and V17A further pass through the metal layers 4M and 3M (the said vias are designated by 3V).

Figure 3F:
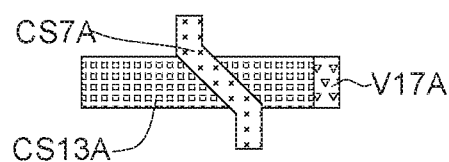

As indicated in FIG. 3F, the conducting section CS7A is formed on the metal layer 3M; the via V17A passes through the metal layers 3M and 2M (the said vias are designated by 2V); a conducting section CS13A is additionally formed on the metal layer 2M; the DC level signals may be transmitted to the semi-turn coils C6A and C12A (located on the metal layer 7M) of the on-chip balun transformer 100A from an external signal line (passing through the metal layer 2M) through the conducting section CS13A and the via V17A.

Second Embodiment

Figure 4:
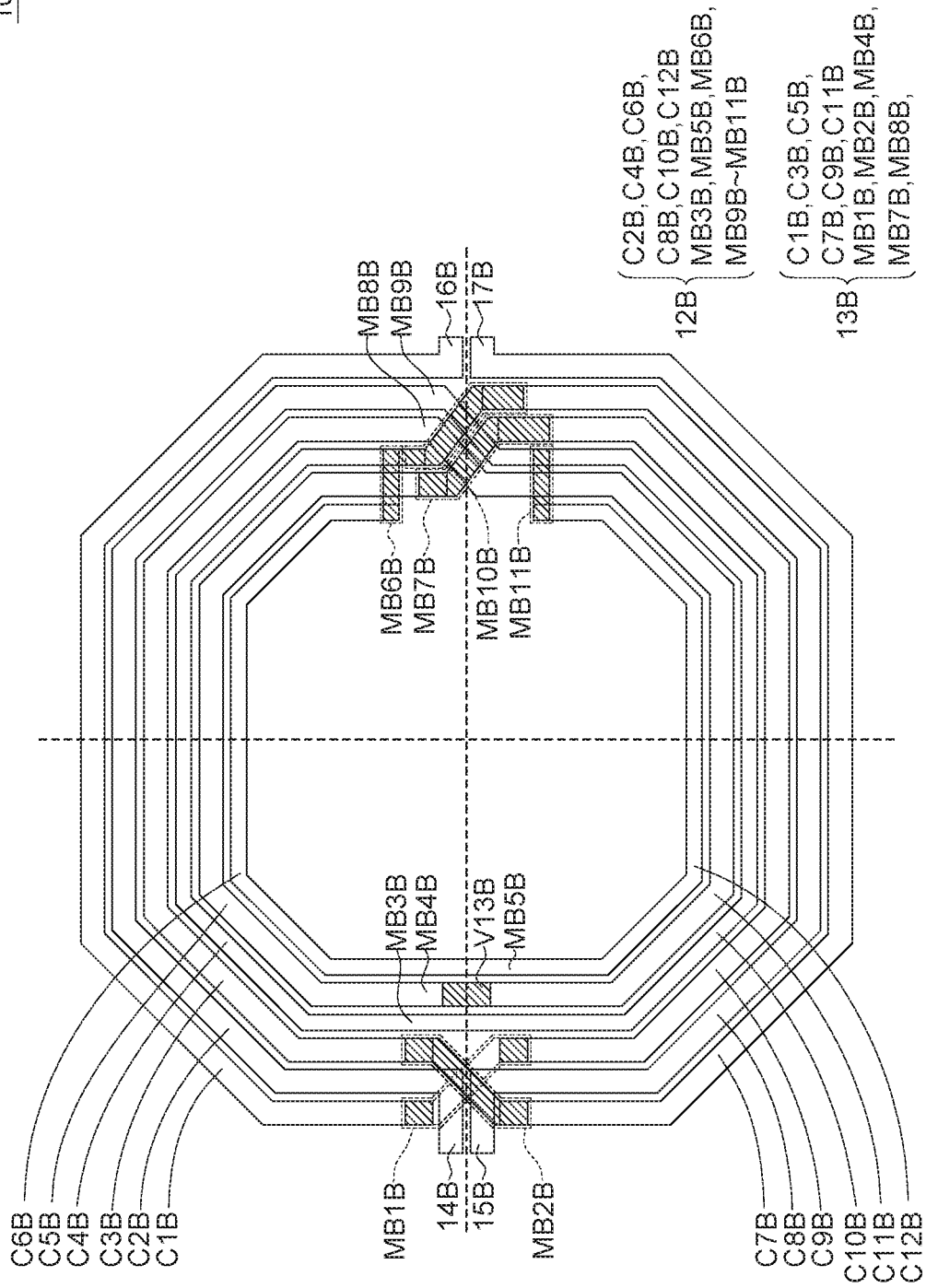
FIG. 4 is a front view of an on-chip balun transformer according to a second embodiment of the present disclosure.

Refer to FIG. 4, FIGS. 2 and 5A-5F. FIG. 4 is a front view of an on-chip balun transformer according to a second embodiment of the present disclosure. FIGS. 5A-5F respectively are schematic diagrams of the balun transformer elements formed on the metal layers 2M-7M in the second embodiment of the present disclosure.

The on-chip balun transformer 100B according to a second embodiment of the present disclosure includes a primary winding 12B and a secondary winding 13B magnetically coupled to the primary winding 12B. The primary winding 12B and the secondary winding 13B are coplanar.

The primary winding 12B includes semi-turn coils C2B, C4B, C6B, C8B, C10B and C12B, and metal bridges MB3B, MB5B, MB6B, MB9B, MB10B and MB11B.

The secondary winding 13B includes semi-turn coils C1B, C3B, C5B, C7B, C9B and C11B and metal bridges MB1B, MB2B, MB4B, MB7B and MB8B.

Additionally, the primary winding 12B further includes a first port 14B and a second port 15B. The first port 14B is connected to the semi-turn coil C2B. The second port 15B is connected to the semi-turn coil C8B. The primary winding 12B may be coupled/connected to an antenna (not illustrated) through the first port 14B and the second port 15B.

The secondary winding 13B further includes a third port 16B and a fourth port 17B. The third port 16B is connected to the semi-turn coil C1B. The fourth port 17B is connected to the semi-turn coil C7B. The secondary winding 13B may be coupled/connected to a back-end circuit (such as the differential amplifier) through the third port 16B and the fourth port 17B.

The semi-turn coil C4B and the semi-turn coil C6B form a parallel semi-turn coil through the metal bridge MB6B.

Similarly, the semi-turn coil C10B and the semi-turn coil C12B form another parallel semi-turn coil through the metal bridge MB11B.

The right end of the semi-turn coil C1B is connected to the third port 16B. The left end of the semi-turn coil C1B is connected to the right end of the semi-turn coil C9B through the metal bridge MB1B.

The right end of the semi-turn coil C2B is connected to the right end of the semi-turn coil C10B through the metal bridge MB9B. The left end of the semi-turn coil C2B is connected to the first port 14B.

The right end of the semi-turn coil C3B is connected to the right end of the semi-turn coil C11B through the metal bridge MB8B. The left end of the semi-turn coil C3B is connected to the left end of the semi-turn coil C7B through the metal bridge MB2B.

The right end of the semi-turn coil C4B is connected to the right end of the semi-turn coil C8B through the metal bridge MB10B. The left end of the semi-turn coil C4B is connected to the left end of the semi-turn coil C10B through the metal bridge MB3B.

The right end of the semi-turn coil C5B is connected to the right end of the semi-turn coil C9B through the metal bridge MB7B. The left end of the semi-turn coil C5B is connected to the left end of the semi-turn coil C11B through the metal bridge MB4B.

The right end of the semi-turn coil C6B is connected to the right end of the semi-turn coil C8B through the metal bridges MB6B and MB10B. The left end of the semi-turn coil C6B is connected to the left end of the semi-turn coil C12B through the metal bridge MB5B.

The right end of the semi-turn coil C7B is connected to the fourth port 17B. The left end of the semi-turn coil C7B is connected to the right end of the semi-turn coil C3B through the metal bridge MB2B.

The right end of the semi-turn coil C8B is connected to the left end of the semi-turn coil C4B through the metal bridge MB10B. The left end of the semi-turn coil C8B is connected to the second port 15B.

The right end of the semi-turn coil C9B is connected to the right end of the semi-turn coil C5B through the metal bridge MB7B. The left end of the semi-turn coil C9B is connected to the right end of the semi-turn coil C1B through the metal bridge MB1B.

The right end of the semi-turn coil C10B is connected to the right end of the semi-turn coil C2B through the metal bridge MB9B. The left end of the semi-turn coil C10B is connected to the left end of the semi-turn coil C4B through the metal bridge MB3B.

The right end of the semi-turn coil C11B is connected to the right end of the semi-turn coil C3B through the metal bridge MB8B. The left end of the semi-turn coil C11B is connected to the left end of the semi-turn coil C5B through the metal bridge MB4B.

The right end of the semi-turn coil C12B is connected to the right end of the semi-turn coil C2B through the metal bridges MB11A and MB9B. The left end of the semi-turn coil C12B is connected to the left end of the semi-turn coil C6B through the metal bridge MB5B.

The metal bridge MB1B includes vias V1B and V2B and a conducting section CS1B electrically connected to the vias V1B and V2B. The metal bridge MB2B includes vias V3B and V4B and a conducting section CS2B electrically connected to the vias V3B and V4B. The metal bridge MB6B includes vias V5B and V6B and a conducting section CS6B electrically connected to the vias V5B and V6B. The metal bridge MB7B includes vias V7B and V8B and a conducting section CS7B electrically connected to the vias V7B and V8B. The metal bridge MB10B includes vias V9B and V10B and a conducting section CS10B electrically connected to the vias V9B and V10B. The metal bridge MB11B includes vias V11B and V12B and a conducting section CS11B electrically connected to the vias V11B and V12B.

Figure 5A:
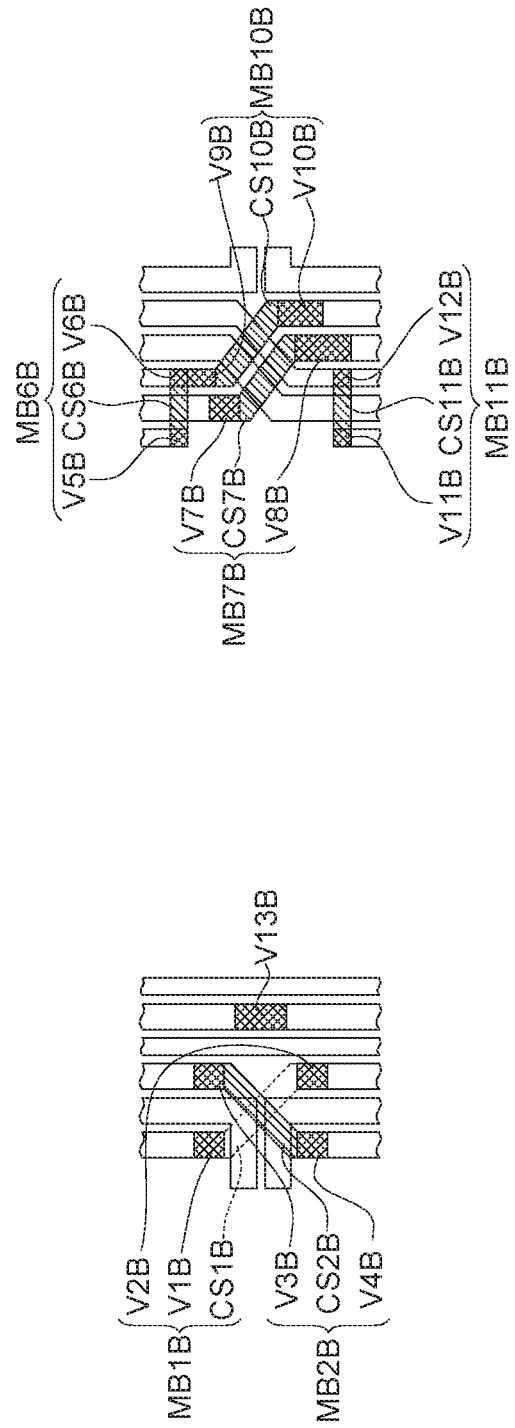
FIGS. 5A-5F respectively are schematic diagrams of the balun transformer elements formed on the metal layers 2M-7M in the second embodiment of the present disclosure.
Figure 5B:
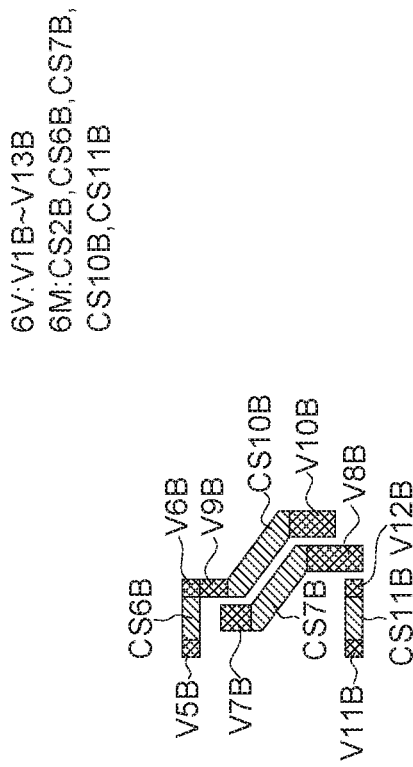

As indicated in FIG. 5A and FIG. 5B, the elements formed on the metal layer 7M includes the semi-turn coils C1B-C12B and the metal bridges MB3B-MB5B, MB8B and MB9B. The vias V1B-V13B pass through the metal layers 7M and 6M (the said vias are designated by 6V, and the designations 1V-5V are defined in the same way). The conducting section CS2B, CS6B, CS7B, CS10B and CS11B are formed on the metal layer 6M.

Figure 5C:
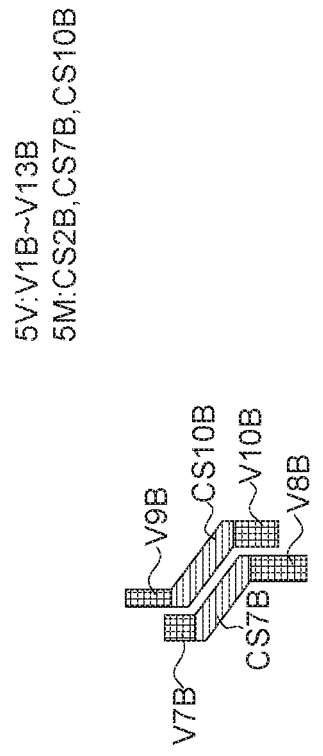

As indicated in FIG. 5C, the vias V1B-V13B further pass through the metal layers 6M and 5M (the said vias are designated by 5V); the conducting sections CS2B, CS7B, CS10B are formed on the metal layer 5M.

Figure 5D:
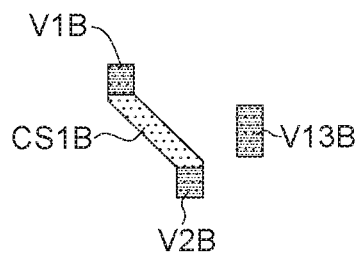

As indicated in FIG. 5D, the conducting section CS1B is formed on the metal layer 4M; the vias V1B, V2B and V13B further pass through the metal layers 5M and 4M (the said vias are designated by 4V).

Figure 5E:
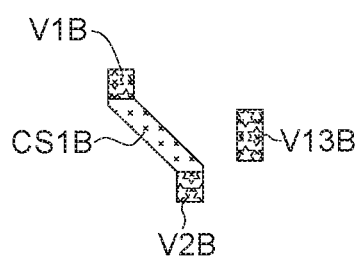

As indicated in FIG. 5E, the conducting section CS1B is formed on the metal layer 3M; the vias V1B, V2B and V13B further pass through the metal layers 4M and 3M (the said vias are designated by 3V).

Figure 5F:
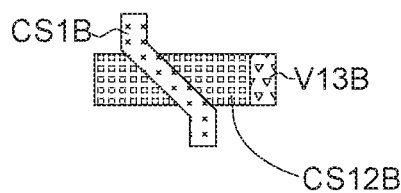

As indicated in FIG. 5F, the conducting section CS1B is formed on the metal layer 3M; the via V13B passes through the metal layers 3M and 2M (the said vias are designated by 2V); a conducting section CS13B is additionally formed on the metal layer 2M; the DC level signals are transmitted to the semi-turn coils C5B and C11B (located on the metal layer 7M) of the on-chip balun transformer 100B from an external signal line (passing through the metal layer 2M) through the conducting section CS13B and the via V13B.

Third Embodiment

Figure 6:
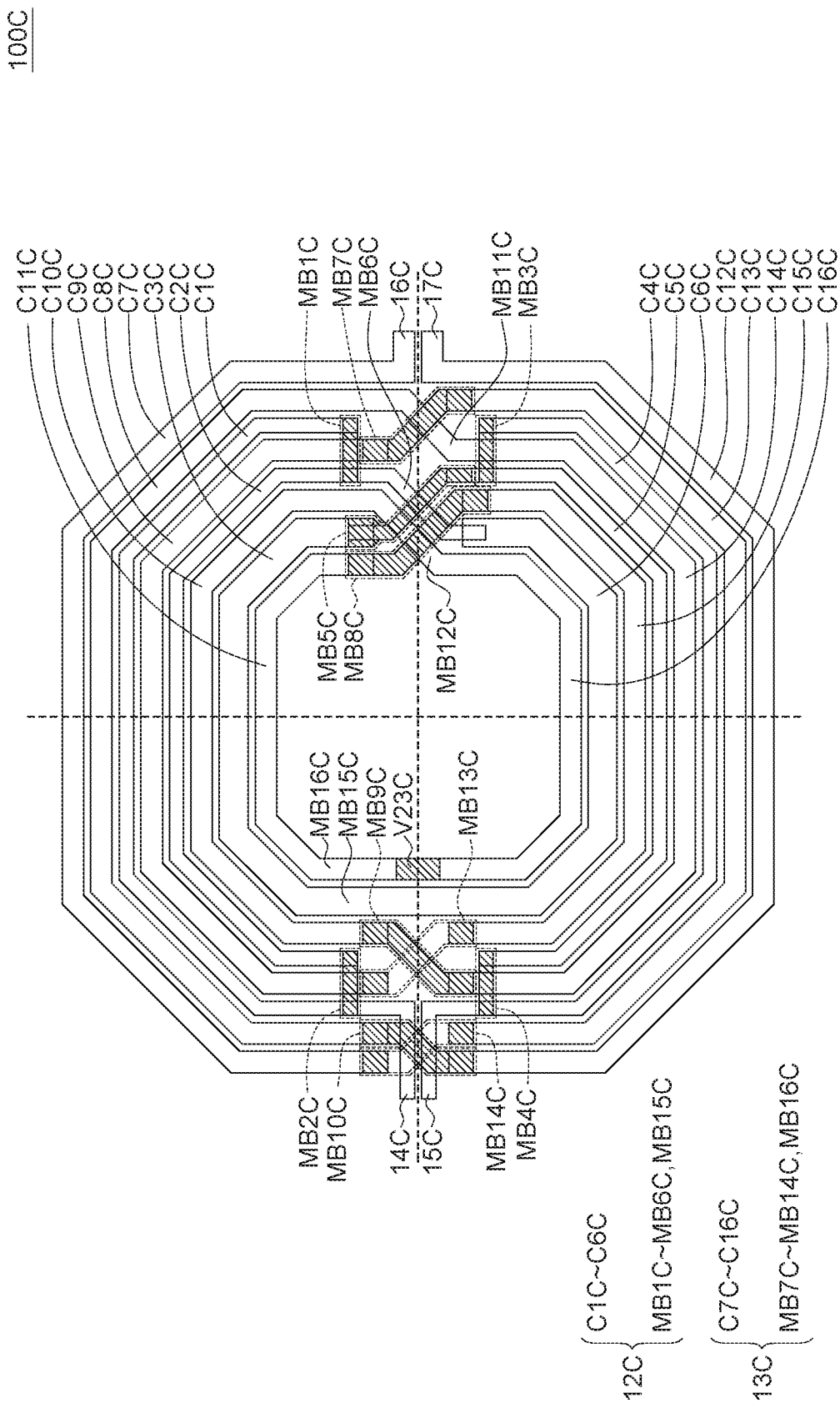
FIG. 6 is a front view of an on-chip balun transformer according to a third embodiment of the present disclosure.

Refer to FIG. 6, FIGS. 2 and 7A-7F. FIG. 6 is a front view of an on-chip balun transformer according to a third embodiment of the present disclosure. FIGS. 7A-7F respectively are schematic diagrams of the balun transformer elements formed on the metal layers 2M-7M in the third embodiment of the present disclosure.

The on-chip balun transformer 100C according to a third embodiment of the present disclosure includes a primary winding 12C and a secondary winding 130 magnetically coupled to the primary winding 12C. The primary winding 12C and the secondary winding 13C are coplanar. The primary winding 12C includes semi-turn coils C1C-C6C and metal bridges MB1C-MB6C and MB15C.

The semi-turn coils C1C and C2C form a first parallel semi-turn coil through the metal bridges MB1C and MB2C. Similarly, the semi-turn coils C4C and C5C form a second parallel semi-turn coil through the metal bridges MB3C and MB4C. The first parallel semi-turn coil is connected to the semi-turn coil C6C through the metal bridge MB6C. The second parallel semi-turn coil is connected to the semi-turn coil C3C through the metal bridge MB5C.

The right end of the semi-turn coil C1C is connected to the right end of the semi-turn coil C6C through the metal bridges MB1C and MB6C. The left end of the semi-turn coil C1C is connected to the first port 14C.

The right end of the semi-turn coil C2C is connected to the right end of the semi-turn coil C6C through the metal bridge MB6C. The left end of the semi-turn coil C2C is connected to the first port 14C through the metal bridge MB2C.

The right end of the semi-turn coil C3C is connected to the right end of the semi-turn coil C5C through the metal bridge MB5C. The left end of the semi-turn coil C3C is connected to the left end of the semi-turn coil C6C through the fifteenth metal bridge MB15C.

The right end of the semi-turn coil C4C is connected to the right end of the semi-turn coil C3C through the metal bridges MB3C and MB5C. The left end of the semi-turn coil C4C is connected to the second port 15C.

The right end of the semi-turn coil C5C is connected to the right end of the semi-turn coil C3C through the metal bridge MB5C. The left end of the semi-turn coil C5C is connected to the second port 15C through the metal bridge MB4C.

The right end of the semi-turn coil C6C is connected to the right end of the semi-turn coil C2C through the metal bridge MB6C. The left end of the semi-turn coil C6C is connected to the left end of the semi-turn coil C3C through the metal bridge MB15C.

The metal bridge MB1C includes vias V1C and V2C and a conducting section CS1C electrically connected to the vias V1C and V2C. The metal bridge MB2C includes vias V3C and V4C and a conducting section CS2C electrically connected to the vias V3C and V4C. The metal bridge MB3C includes vias V5C and V6C and a conducting section CS3C electrically connected to the vias V5C and V6C. The metal bridge MB4C includes vias V7C and V8C and a conducting section CS4C electrically connected to the vias V7C and V8C. The metal bridge MB5C includes vias V9C and V10C and a conducting section CS5C electrically connected to the vias V9C and V10C.

Besides, the primary winding 12C further includes a first port 14C and a second port 15C. The first port 14C is connected to the semi-turn coil C1C. The second port 15C is connected to the semi-turn coil C4C. The primary winding 12C may be coupled/connected to an antenna (not illustrated) through the first port 14C and the second port 15C.

The secondary winding 13C includes semi-turn coils C7C-C16C and metal bridges MB7C-MB14C and MB16C. The secondary winding 13C further includes a third port 16C and a fourth port 17C. The third port 16C is connected to the semi-turn coil C7C. The fourth port 17C is connected to the semi-turn coil C12C. The secondary winding 13C may be coupled/connected to a back-end circuit (such as the differential amplifier) through the third port 16C and the fourth port 17C.

The right end of the semi-turn coil C7C is connected to the third port 16C. The left end of the semi-turn coil C7C is connected to the left end of the semi-turn coil C13C through the metal bridge MB14C.

The right end of the semi-turn coil C8C is connected to the right end of the semi-turn coil C14C through the metal bridge MB11C. The left end of the semi-turn coil C8C is connected to the left end of the semi-turn coil C12C through the metal bridge MB10C.

The right end of the semi-turn coil C9C is connected to the right end of the semi-turn coil C13C through the metal bridge MB7C. The left end of the semi-turn coil C9C is connected to the left end of the semi-turn coil C15C through the metal bridge MB13C. It should be noted that the semi-turn coil C9C of the secondary winding 13C is located between the semi-turn coils C1C and C2C of the first parallel semi-turn coil of the primary winding 12C. Moreover, the metal bridge MB1C crosses over the semi-turn coil C9C.

The right end of the semi-turn coil C10C is connected to the right end of the semi-turn coil C16C through the metal bridge MB12C. The left end of the se urn coil C10C is connected to the left end of the semi-turn coil C14C through the metal bridge MB9C.

The right end of the semi-turn coil C11C is connected to the right end of the semi-turn coil C15C through the metal bridge MB8C. The left end of the semi-turn coil C11C is connected to the left end of the semi-turn coil C16C through the metal bridge MB16C.

The right end of the semi-turn coil C12C is connected to the fourth port 17C. The left end of the semi-turn coil C12C is connected to the left end of the semi-turn coil C8C through the metal bridge MB10C.

The right end of the semi-turn coil C13C is connected to the right end of the semi-turn coil C9C through the metal bridge MB7C. The left end of the semi-turn coil C13C is connected to the left end of the semi-turn coil C7C through the metal bridge MB14C.

The right end of the semi-turn coil C14C is connected to the right end of the semi-turn coil C8C through the metal bridge MB11C. The left end of the semi-turn coil C14C is connected to the left end of the semi-turn coil C10C through the metal bridge MB9C. It should be noted that the semi-turn coil C14C of the secondary winding 13C is located between the semi-turn coils C4C and C5C of the second parallel semi-turn coil of the primary winding 12C.

The right end of the semi-turn coil C15C is connected to the right end of the semi-turn coil C11C through the metal bridge MB8C. The left end of the semi-turn coil C15C is connected to the left end of the semi-turn coil C9C through the metal bridge MB13C.

The right end of the semi-turn coil C16C is connected to the right end of the semi-turn coil C10C through the metal bridge MB12C. The left end of the semi-turn coil C16C is connected to the left end of the semi-turn coil C11C through the metal bridge MB16C.

The metal bridge MB7C includes vias V11C and V12C and a conducting section CS7C electrically connected to the vias V11C and V12C. The metal bridge MB8C includes vias V13C and V14C and a conducting section CS8C electrically connected to the vias V13C and V14C. The metal bridge MB9C includes vias V15C and V16C and a conducting section CS9C electrically connected to the vias V15C and V16C. The metal bridge MB10C includes vias V17C and V18C and a conducting section CS10C electrically connected to the vias V17C and V18C. The metal bridge MB13C includes vias V19C and V20C and a conducting section CS13C. The metal bridge MB14C includes vias V21C and V22C and a conducting section CS14C electrically connected to the vias V21C and V22C.

Figure 7A:
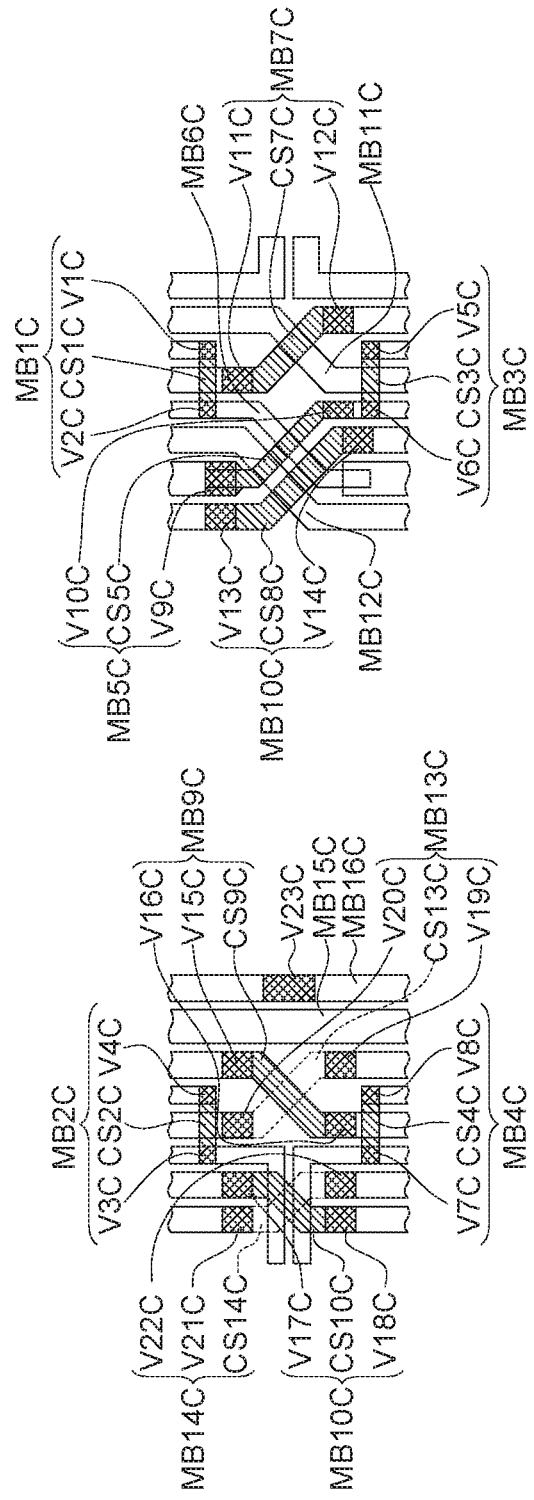
FIGS. 7A-7F respectively are schematic diagrams of the balun transformer elements formed on the metal layers 2M-7M in the third embodiment of the present disclosure.

As indicated in FIG. 7A, the elements formed on the metal layer 7M include the semi-turn coils C1C-C16C and the metal bridges MB6C, MB11C, MB12C, MB15C and MB16C. The vias V1C-V23C pass through the metal layer 7M and the metal layer 6M (the said vias are designated by 6V, the designations 1V-5V are defined in the same way). The conducting sections CS1C-CS5C and CS7C-CS10C are formed on the metal layer 6M.

Let the metal bridge MB1C be taken for example. Based on the architecture that the vias V1C and V2C of the metal bridge MB1C pass through the metal layers 7M and 6M and that the conducting section CS1C is formed on the metal layer M6, the semi-turn coils C1C and C2C may therefore be electrically connected to each other.

Figure 7B:
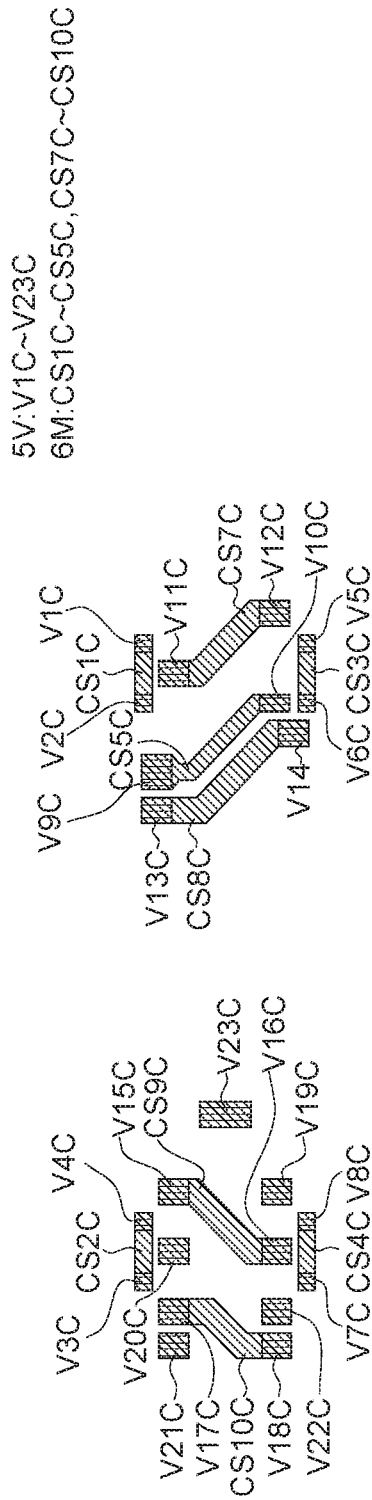

As indicated in FIG. 7B, the vias V1C-V23C further pass through the metal layers 6M and 5M (the said vias are designated by 5V).

Figure 7C:
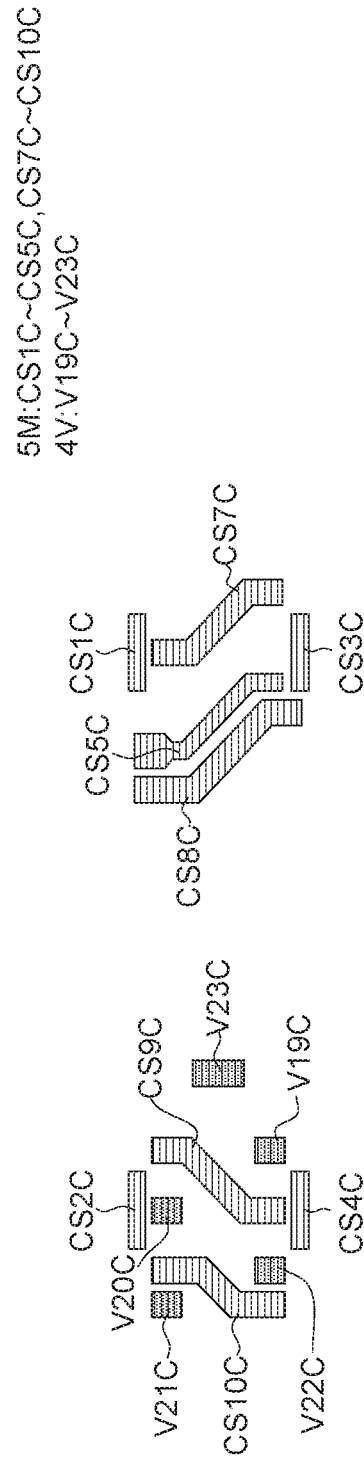

As indicated in FIG. 7C, the conducting sections CS1C-CS5C and CS7C-CS10C are formed on the metal layer 5M; the vias V19C-V23C further pass through the metal layers 5M and 4M (the said vias are designated by 4V). In the third embodiment of the present disclosure, if the conducting sections CS1C-CS5C and CS7C-CS10C are formed on the metal layers 7M, 6M and 5M, the resistance values of the conducting section CS1C-CS5C and CS7C-CS10C will be reduced. The vias V19C-V20C pass through the metal layers 4M-7M, and connect the semi-turn coil C9C and C1C5C through the metal bridge MB13C. Similarly, the vias V21C-V22C pass through the metal layer 4M-7M, and connect the semi-turn coils C7C and C13C through the metal bridge MB14C.

Figure 7D:
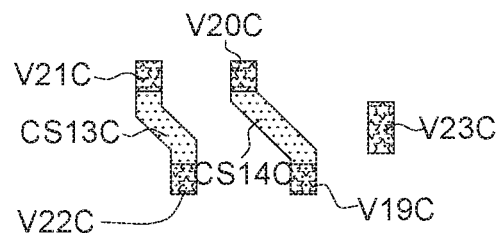

As indicated in FIG. 7D, the conducting sections CS13C and CS14C are formed on the metal layer 4M; the via V23C further passes through the metal layers 4M and 3M (the said vias are designated by 3V).

Figure 7E:
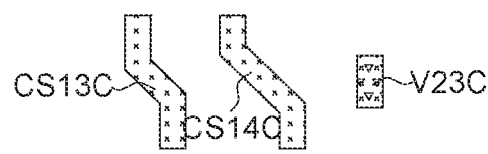

As indicated in FIG. 7E, the conducting sections CS13C and CS14C are formed on the metal layer 3M; the via V23C further passes through the metal layers 3M and 2M (the said vias are designated by 2V). In the present disclosure embodiment, if the conducting sections CS13C and CS14C are formed on the metal layers 4M and 3M, the resistance values of the conducting sections CS13C and CS14C will be reduced. FIG. 7E shows that the via V23C passes through the metal layers 2M-7M.

Figure 7F:
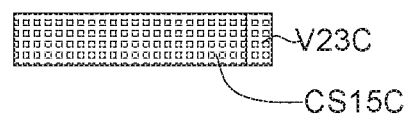

As indicated in FIG. 7F, a conducting section CS15C is additionally formed on the metal layer 2M; the DC level signals are transmitted to the semi-turn coils C16C and C11C (located on the metal layer 7M) of the on-chip balun transformer 100C from an external signal line (passing through the metal layer 2M) through the conducting section CS15C and the via V23C.

Fourth Embodiment

Figure 8:
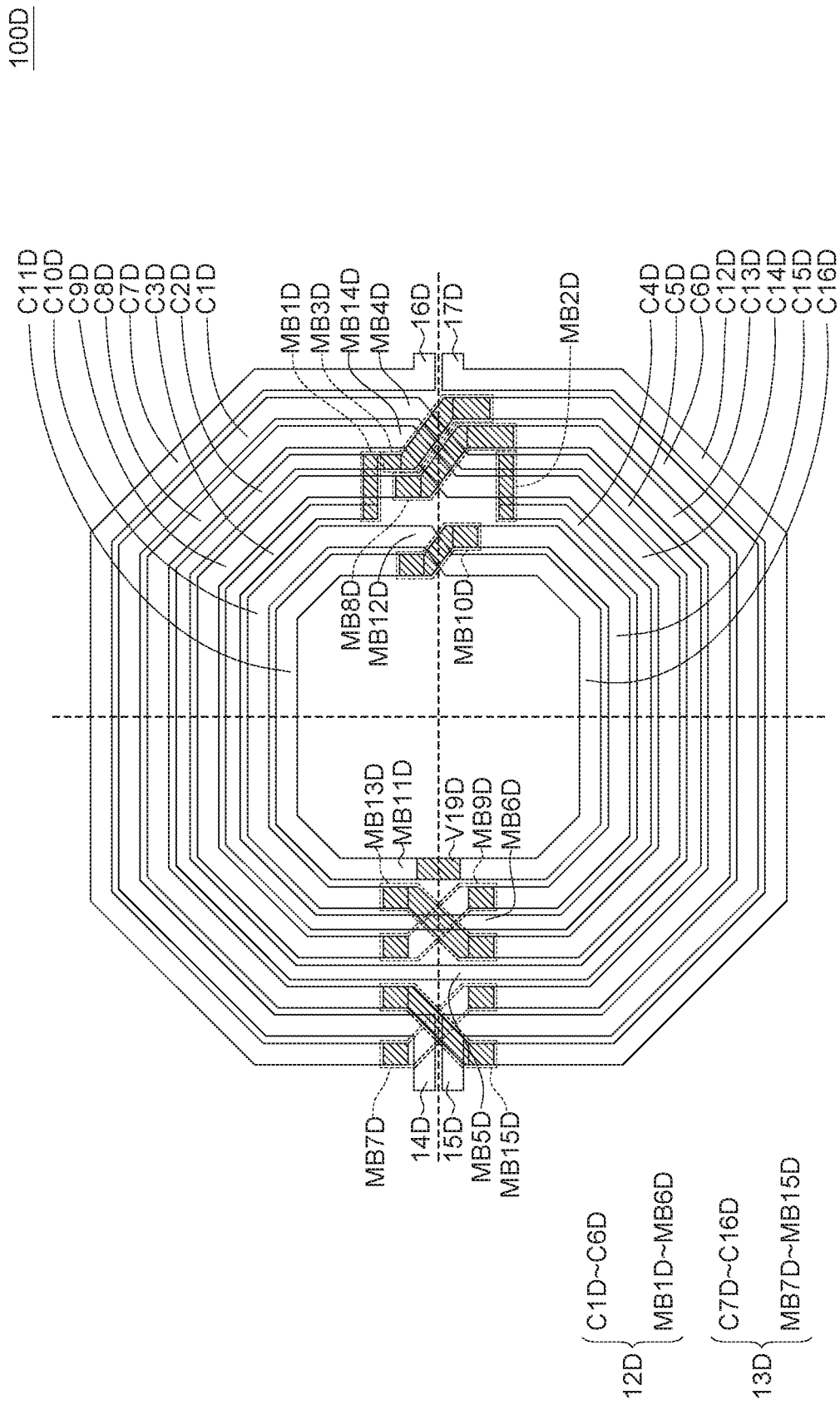
FIG. 8 is a front view of an on-chip balun transformer according to a fourth embodiment of the present disclosure.

Refer to FIGS. 8 and 9A-9F. FIG. 8 is a front view of an on-chip balun transformer according to a fourth embodiment of the present disclosure. FIGS. 9A-9F respectively are schematic diagrams of the balun transformer elements formed on the metal layers 2M-7M in the fourth embodiment of the present disclosure.

The on-chip balun transformer 100D according to a fourth embodiment of the present disclosure includes a primary winding 12D and a secondary winding 13D. The primary winding 12D includes semi-turn coils C1D-C6D and metal bridges MB1D-MB6D.

The semi-turn coils C2D, C3D, C4D and C5D form a parallel full-turn coil through the metal bridges MB1D and MB2D.

The right end of the semi-turn coil C1D is connected to the right end of the semi-turn coil C5D through the metal bridge MB4D. The left end of the semi-turn coil C1D is connected to the first port 14D.

The right end of the semi-turn coil C2C is connected to the right end of the semi-turn coil C6D through the metal bridge MB3D. The left end of the semi-turn coil C2D is connected to the left end of the semi-turn coil C5D through the metal bridge MB5D.

The right end of the semi-turn coil C3D is connected to the right end of the semi-turn coil C6D through the metal bridges MB1D and MB3D. The left end of the semi-turn coil C3D is connected to the left end of the semi-turn coil C4D through the metal bridge MB6D.

The right end of the semi-turn coil C4D is connected to the right end of the semi-turn coil C1D through the metal bridges MB2D and MB4D. The left end of the semi-turn coil C4D is connected to the left end of the semi-turn coil C3D through the metal bridge MB6D.

The right end of the semi-turn coil C5D is connected to the right end of the semi-turn coil C1D through the metal bridge MB4D. The left end of the semi-turn coil C5D is connected to the left end of the semi-turn coil C2D through the metal bridge MB5D.

The right end of the semi-turn coil C6D is connected to the right end of the semi-turn coil C2D through the metal bridge MB3D. The left end of the semi-turn coil C6D is connected to the second port 15D.

The metal bridge MB1D includes vias V1D and V2D and a conducting section CS1D electrically connected to the vias V1D and V2D. The metal bridge MB2D includes vias V3D and V4D and a conducting section CS2D electrically connected to the vias V3D and V4D. The metal bridge MB3D includes vias V5D and V6D and a conducting section CS3D electrically connected to the vias V5D and V6D.

Additionally, the primary winding 12D further includes a first port 14D and a second port 15D. The first port 14D is connected to the semi-turn coil C1D. The second port 15D is connected to the semi-turn coil C6D. The primary winding 12D may be coupled/connected to an antenna (not illustrated) through the first port 14D and the second port 15D.

The secondary winding 13D includes semi-turn coils C7D-C16D and metal bridges MB7D-MB15D. The secondary winding 13D further includes a third port 16D and a fourth port 17D. The third port 16D is connected to the semi-turn coil C7D. The fourth port 17D is connected to the semi-turn coil C12D. The secondary winding 13D may be coupled/connected to a back-end circuit (such as the differential amplifier) through the third port 16D and the fourth port 17D.

The right end of the semi-turn coil C7D is connected to the third port 16D. The left end of the semi-turn coil C7D is connected to the left end of the semi-turn coil C13D through the metal bridge MB7D.

The right end of the semi-turn coil C8D is connected to the right end of the semi-turn coil C14C through the metal bridge MB14D. The left end of the semi-turn coil C8D is connected to the left end of the semi-turn coil C12D through the metal bridge MB15D.

The right end of the semi-turn coil C9D is connected to the right end of the semi-turn coil C13D through the metal bridge MB8D. The left end of the semi-turn coil C9D is connected to the left end of the semi-turn coil C15D through the metal bridge MB9D.

The right end of the semi-turn coil C10D is connected to the right end of the semi-turn coil C16D through the metal bridge MB12D. The left end of the semi-turn coil C10D is connected to the left end of the semi-turn coil C14D through the metal bridge MB13D.

The right end of the semi-turn coil C11D is connected to the right end of the semi-turn coil C15C through the metal bridge MB10D. The left end of the semi-turn coil C11D is connected to the left end of the semi-turn coil C16D through the metal bridge MB11D.

The right end of the semi-turn coil C12D is connected to the fourth port 17D. The left end of the semi-turn coil C12D is connected to the left end of the semi-turn coil C8D through the metal bridge MB15D.

The right end of the semi-turn coil C13D is connected to the right end of the semi-turn coil C9D through the metal bridge MB8D. The left end of the semi-turn coil C13D is connected to the left end of the semi-turn coil C7D through the metal bridge MB7D.

The right end of the semi-turn coil C14D is connected to the right end of the semi-turn coil C8D through the metal bridge MB14D. The left end of the semi-turn coil C14D is connected to the left end of the semi-turn coil C10D through the metal bridge MB13D.

The right end of the semi-turn coil C15D is connected to the right end of the semi-turn coil C11D through the metal bridge MB10D. The left end of the se urn coil C15D is connected to the left end of the semi-turn coil C9D through the metal bridge MB9D.

The right end of the semi-turn coil C16D is connected to the right end of the semi-turn coil C10D through the metal bridge MB12D. The left end of the semi-turn coil C16D is connected to the left end of the semi-turn coil C11D through the metal bridge MB11D.

It should be noted that the semi-turn coils C9D and C14D of the secondary winding 13D are located into the parallel full-turn coil of the primary winding 12D. That is, the semi-turn coil C9D of the secondary winding 13D is located between the semi-turn coils C2D and C3D of the primary winding 12D; the semi-turn coil C14D of the secondary winding 13D is located between the semi-turn coils C4D and C5D of the primary winding 12D. Moreover, the metal bridge MB1D crosses over the semi-turn coil C9D.

The metal bridge MB7D includes vias V7D and V8D and a conducting section CS7D electrically connected to the vias V7D and V8D. The metal bridge MB8D includes vias V9D and V10D and a conducting section CS8D electrically connected to the vias V9D and V10D. The metal bridge MB9A includes vias V11D and V12D and a conducting section CS9D electrically connected to the vias V11D and V12D. The metal bridge MB10D includes vias V13D and V14D and a conducting section CS10D electrically connected to the vias V13D and V14D. The metal bridge MB13D includes vias V15D and V16D and a conducting section CS13D electrically connected to the vias V15D and V16D. The metal bridge MB15D includes vias V17D and V18D and a conducting section CS15D electrically connected to the vias V17D and V18D.

Figure 9A:
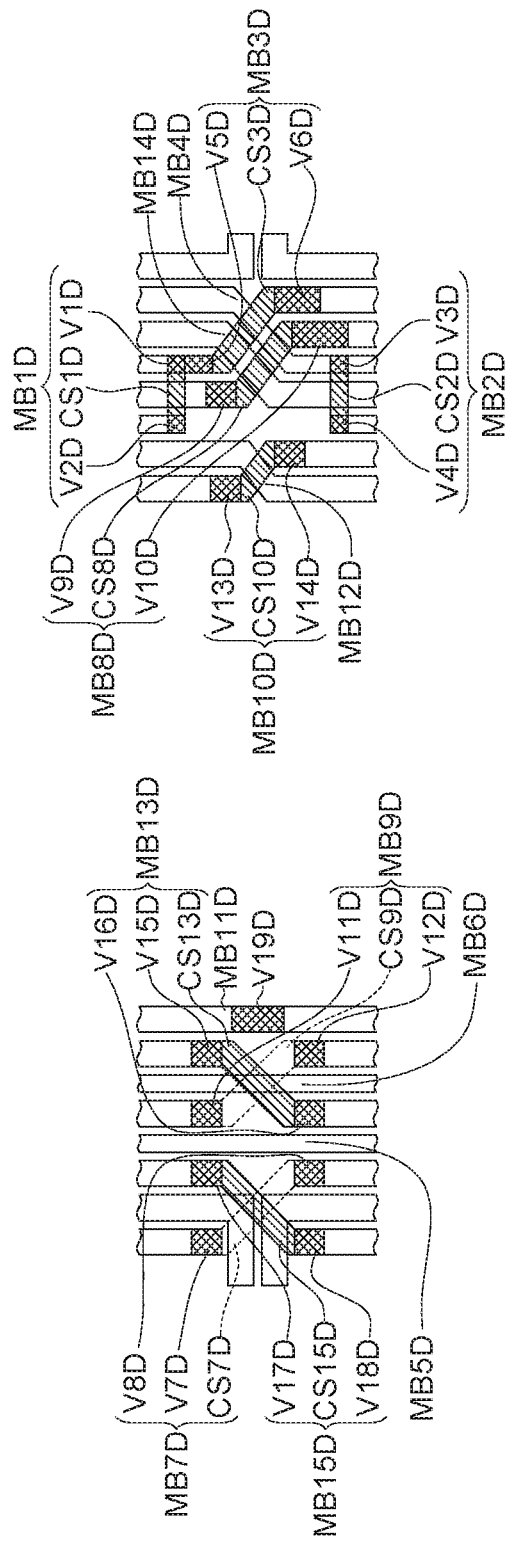

As indicated in FIG. 9A, the elements formed on the metal layer 7M include the semi-turn coils C1D-C16D and the metal bridges MB4D-MB6D, MB11D, MB12D and MB14D. The vias V1D-V19D pass through the metal layer 7M and the metal layer 6M (the said vias are designated by 6V, the designations 1V-5V are defined in the same way).

As indicated in FIG. 9B, the conducting sections CS1D-CS3D, CS8D, CS10D, CS13D and CS15D are formed on the metal layer 6M. The vias V5D-V19D further pass through the metal layer 6M and the metal layer 5M (the said vias are designated by 5V).

As indicated in FIG. 9C, the conducting sections CS3D, CS8D, CS10D, CS13D and CS15D are formed on the metal layer 5M: the vias V7D, V8D, V11D, V12D, and V19D further pass through the metal layer 5M and the metal layer 4M (the said vias are designated by 4V). Similarly, in the fourth embodiment of the present disclosure, if the conducting sections are formed on multiple metal layers, the resistance values of the conducting sections will be reduced.

Figure 9D:
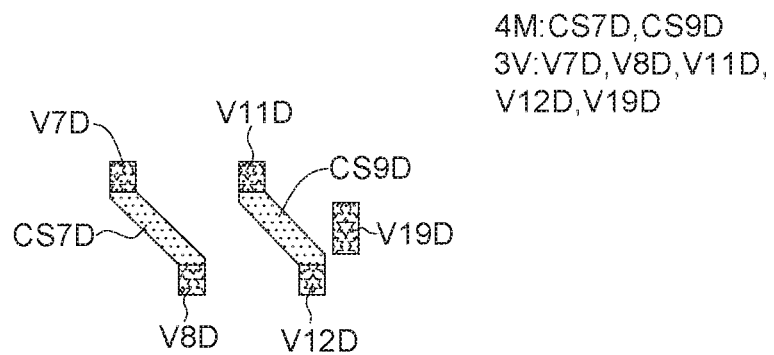

As indicated in FIG. 9D, the conducting sections CS13D and CS15D are formed on the metal layer 4M; the vias V7D, V8D, V11D, V12D and V19D further pass through the metal layers 4M and 3M (the said vias are designated by 3V).

Figure 9E:
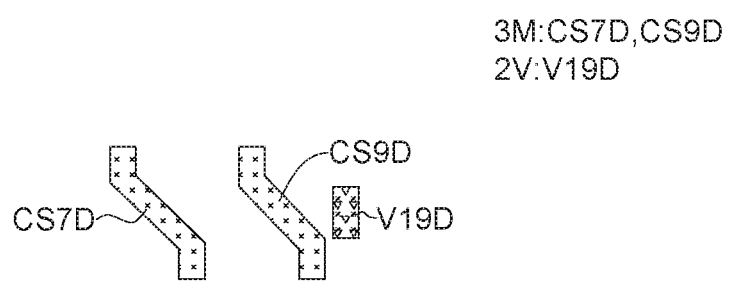

As indicated in FIG. 9E, the conducting sections CS13D and CS15D are formed on the metal layer 3M; the via V19D further pass through the metal layer 3M and the metal layer 2M (the said vias are designated by 2V).

Figure 9F:
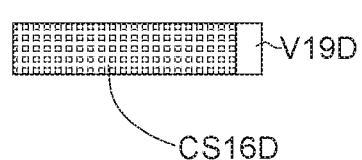

As indicated in FIG. 9F, a conducting section CS16D is additionally formed on the metal layers 2M; the DC level signals are transmitted to the on-chip balun transformer 100D from the exterior through the conducting section CS16D.

In above embodiments of the present disclosure, if necessary, more parallel semi-turn coils (the first embodiment and/or the third embodiment) or more parallel full-turn coils (the second embodiment and/or the fourth embodiment) may be formed to increase the coupling factor.

Moreover, if the impedance needs to be adjusted, more semi-turn coils (not used for forming parallel semi-turn coil and parallel full-turn coil) may be formed.

Besides, in the above embodiments of the present disclosure, the topmost metal layer (that is, 7M) may be formed using a thick metal process to reduce the loss.

In above embodiments of the present disclosure, since the primary winding includes a parallel architecture and a serial architecture, the primary winding may be regarded as an asymmetrical winding inductor, and the secondary winding may be regarded as a symmetrical winding inductor. Let FIG. 6 be taken for example. The semi-turn coils C1C and C2C form a parallel semi-turn coil (parallel architecture) through the metal bridges MB1C and MB2C. The remaining semi-turn coils (such as the semi-turn coil C6C) are coupled to the parallel semi-turn coil through the metal bridges. Therefore, the remaining semi-turn coils not used for forming the parallel semi-turn/full-turn coil may be regarded as a serial architecture and may also be referred as serial semi-turn coils. The parallel semi-turn coils and the parallel full-turn coils may be referred as parallel coils. Besides, the metal bridges connecting the semi-turn coils to form the parallel semi-turn coils may also be referred as a first metal bridge group (such as the metal bridges MB1C-MB4C of FIG. 6); the metal bridges connecting the semi-turn coils to form the parallel full-turn coils may also be referred as a second metal bridge group (such as the metal bridges MB1D-MB2D of FIG. 8); the remaining metal bridges may also be referred as a third metal bridge group.

Let FIG. 6 be taken for example. Viewing from the direction of the first port 14C, the architecture of the primary winding is a parallel architecture and a serial architecture in sequence. Let FIG. 8 be taken for example. Viewing from the direction of the first port 14D, the architecture of the primary winding is a serial architecture and a parallel architecture in sequence. That is, in above embodiments of the present disclosure, the architecture of the primary winding includes parallel semi-turn coils (parallel full-turn coils) and serial semi-turn coils; the secondary winding includes a serial architecture.

Figure 10:
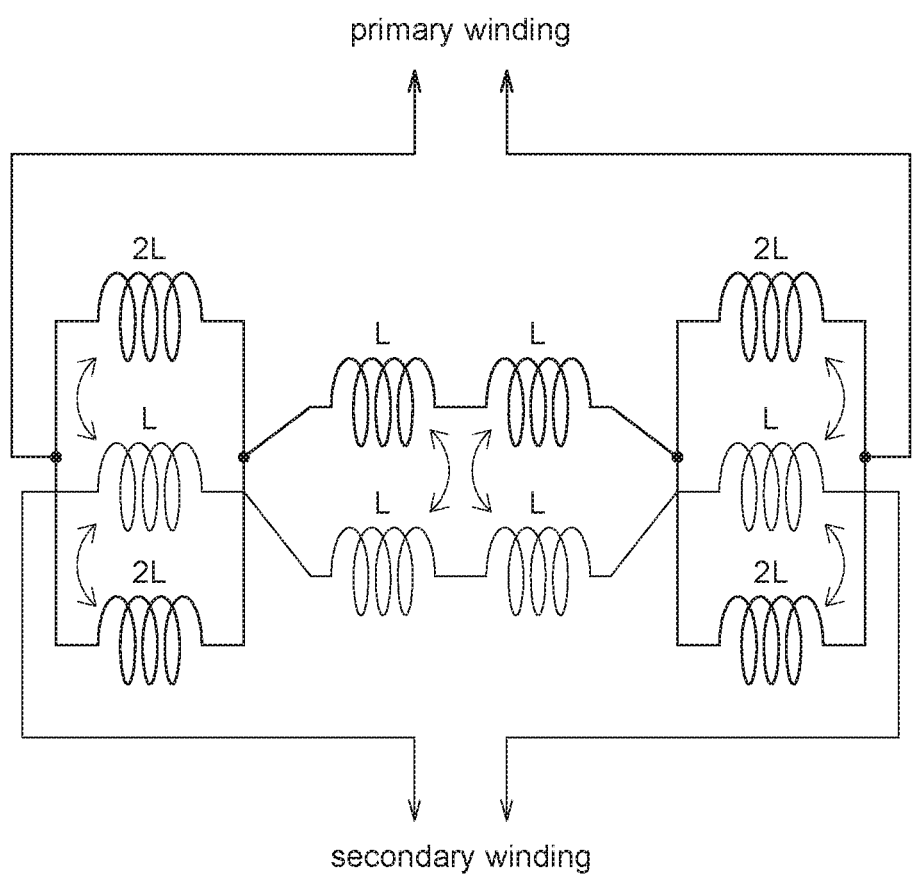
FIG. 10 is an equivalent circuit of a balun transformer according to an embodiment of the present disclosure.

FIG. 10 is an equivalent circuit of a balun transformer according to an embodiment of the present disclosure. FIG. 10 is merely a possible embodiment of the present disclosure, not for limiting the present disclosure. In practical application, the primary winding and the secondary winding of the balun transformer according to the above embodiments of the present disclosure may be arranged as a serial architecture, a parallel architecture or a combination thereof to achieve the required impedance matching.

Additionally, in above embodiments of the present disclosure, the vertical metal winding of the transformer may be added to avoid induced current from generating in the substrate, such that the loss may be reduced and the transformer quality factor may be increased.

In above embodiments of the present disclosure, the coil ratio may be increased to achieve high impedance matching and low impedance matching.

In above embodiments of the present disclosure may increase high coupling (increase the quantity of semi-turn coils) to reduce the loss.

The above embodiments of the present disclosure may be used in high frequency-width and high frequency application.

While the invention has been described by way of example and in terms of the embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An on-chip balun transformer, comprising:
a primary winding, wherein the primary winding is an asymmetrical winding inductor and comprises at least one parallel-connected coil and a plurality of first serial semi-turn coils connected to the at least one parallel-connected coil through a plurality of first metal bridges;
a secondary winding magnetically coupled to the primary winding, wherein the secondary winding is a symmetrical winding inductor and comprises a plurality of second serial semi-turn coils connected to each other through a plurality of second metal bridges, wherein only a part of the second metal bridges is intersected with the first metal bridges;
wherein, at least one of the second serial semi-turn coils is located within the at least one parallel-connected coil;
the primary winding and the secondary winding are coplanar.

2. The on-chip balun transformer according to claim 1, wherein, the at least one parallel-connected coil comprises a plurality of parallel-connected semi-turn coils each comprising a plurality of semi-turn coils and a first metal bridge group, the first metal bridge group connects terminals of the semi-turn coils and crosses over the second serial semi-turn coils of the secondary winding.

3. The on-chip balun transformer according to claim 1, wherein, the at least one parallel-connected coil comprises at least one parallel-connected full-turn coil comprising a plurality of semi-turn coils and a second metal bridge group, the second metal bridge group connects terminals of the semi-turn coils and crosses over the second serial semi-turn coils of the secondary winding.

4. The on-chip balun transformer according to claim 2, wherein, the on-chip balun transformer is formed in N metal layers (N is a positive integer) on a semiconductor substrate in a bottom-up manner,
the parallel-connected coil, the first serial semi-turn coils and the second serial semi-turn coils is formed on an N-th metal layer of the N metal layers;
the first metal bridge group is formed on an (N-1)-th metal layer of the N metal layers;
the on-chip balun transformer further comprises a third metal bridge group formed on a second metal layer to an (N-2)-th metal layer of the N metal layers.

5. The on-chip balun transformer according to claim 3, wherein, the on-chip balun transformer is formed in N metal layers (N is a positive integer) on a semiconductor substrate in a bottom-up manner,
the parallel-connected coil, the first serial semi-turn coils and the second serial semi-turn coils are formed on an N-th metal layer of the N metal layers;
the second metal bridge group is formed on an (N-1)-th metal layer of the N metal layers;
the on-chip balun transformer further comprises a third metal bridge group formed on a second metal layer to an (N-2)-th metal layer of the N metal layers.

* * * * *